United States Patent [19]

Blakeslee

[11] 4,354,235

[45] Oct. 12, 1982

[54] GUIDANCE SYSTEM DETECTOR CIRCUIT

[75] Inventor: Thomas R. Blakeslee, Woodside, Calif.

[73] Assignee: Portec, Inc., Oak Brook, Ill.

[21] Appl. No.: 164,077

[22] Filed: Jun. 30, 1980

[51] Int. Cl.³ .................. G06J 1/00; G06G 7/18; H03K 5/00

[52] U.S. Cl. .................. 364/424; 307/236; 307/358; 307/494; 328/26; 363/125; 364/602; 364/830

[58] Field of Search ............... 364/424, 807, 829, 830, 364/851, 602, 605, 607, 608; 307/350, 356, 358, 361, 236, 494; 328/26, 32, 117, 118, 127, 150, 133; 363/15, 34, 74, 125

[56] References Cited

U.S. PATENT DOCUMENTS

| | | | |
|---|---|---|---|
| 3,697,782 | 10/1972 | Matouka | 307/236 X |
| 3,760,255 | 9/1973 | Grodinsky | 307/350 X |
| 4,013,955 | 3/1977 | Wagner | 363/125 X |
| 4,109,308 | 8/1978 | Rodel | 363/125 |
| 4,277,753 | 7/1981 | Faulkner | 328/26 |

Primary Examiner—Joseph F. Ruggiero
Attorney, Agent, or Firm—Hill, Van Santen, Steadman, Chiara & Simpson

[57] ABSTRACT

A guidance system is disclosed which includes a combined synchronous detector, amplifier, and low pass filter. The detector circuit provides a binary signal which is true during negative half cycles of an input signal and false during positive half cycles. The positive and negative half cycles are applied through a switch controlled by the binary signal to a differential amplifier. A first integrator is connected to the first input of the differential amplifier and a second integrator is connected between the output and a second input of the differential amplifier. The direct current level of the output of the differential amplifier rises as the amplitude of the input signal increases to keep the input voltages of the differential amplifier equal. The output voltage of the differential amplifier is therefore proportional to the amplitude of a sensor signal.

10 Claims, 3 Drawing Figures

GUIDANCE SYSTEM DETECTOR CIRCUIT

BACKGROUND OF THE INVENTION

This invention relates to a guidance system using multiple sensors and more particularly to a circuit which combines the functions of a synchronous detector, amplifier and low pass filter in such a guidance system.

In guidance systems of the type which have sensors for following an externally defined path, such as magnetic coil sensors which detect an energized buried wire, the sensor signals must be detected in such a way as to eliminate spurious electronic signals referred to hereinafter as noise. Such noise can be generated by external magnetic fields as well as magnetic fields produced by the vehicle's own electro-mechanical equipment, such as electric motors and the like. A guidance system of the type which is referred to is described in U.S. Pat. No. 4,043,428.

SUMMARY OF THE INVENTION

The present invention comprises a detector circuit for receiving an alternating current input signal, such as a guidance sensor signal, and for generating therefrom a direct current output signal whose magnitude is proportional to the amplitude of the input signal. The detector circuit includes means for generating a binary signal which is true during minus half cycles of the input signal and which is false during positive half cycles of the input signal, differential amplifier means having an output terminal, a first, noninverting input terminal and a second, inverting input terminal, first signal integrating means connected to the first input terminal of the differential amplifier means for time integrating signals supplied thereto, and second signal integrating means connected between the output terminal and the second input terminal of the differential amplifier means.

Switch means, which are controlled by the binary signal, supply the positive half cycles of the input signal to the first input terminal and the negative half cycles of the input signal to the second input terminal. In this way, the direct current level of the output of the differential amplifier will rise as the amplitude of the input signal increases; just enough to keep the voltages on the first and second input terminals of the differential amplifier means equal. The output voltage of the differential amplifier will therefore be proportional to the amplitude of the sensor signal.

In the preferred embodiment, the binary signal generating means comprise a bandpass filter which is supplied with the input signal. The output of the bandpass filter is supplied to a voltage comparator which generates the binary signal. Where multiple sensors are utilized, the outputs of all the sensors are fed through suitable isolating resistors to the input terminal of the bandpass filter. Each sensor is provided with separate differential amplifier means, separate first and second integrating means and separate switch means. The single binary signal from the voltage comparator is then supplied to the separate switch means so that separate DC level output signals for each sensor are provided.

These DC level output signals are converted to digital signals and are applied to the input of a microcomputer which, through a digital to analog converter, controls the pulse width modulated steering motor driver of the vehicle which is to be guided.

By having the frequency of all four sensor circuits be determined by a single bandpass filter, the tuning and frequency selection for the system is greatly simplified. The system of the invention also eliminates mismatches in detector gain due to variations in tuning accuracy.

It is therefore an object of the present invention to provide a combined synchronous detector, amplifier and low pass filter in a guidance system detector circuit.

It is another object of the invention to provide a combined synchronous detector, amplifier and low pass filter in a single inexpensive circuit.

It is still another object of the invention to provide a guidance system detector circuit which is relatively immune to noise signals.

It is still a further object of the invention to provide a guidance system detector circuit which has simplified tuning and frequency selection in a multi-frequency system.

It is yet another object of the invention to provide a guidance system detector circuit which eliminates mismatches in detector gain due to variations in tuning accuracy.

The novel features which are believed to be characteristic of the invention, both as to organization and method of operation, together with further advantages thereof, will be better understood from the following drawings, in which several preferred embodiments of the invention are illustrated by way of example.

DETAILED DESCRIPTION OF THE PREFERRED EMBODIMENTS

Figure 1:
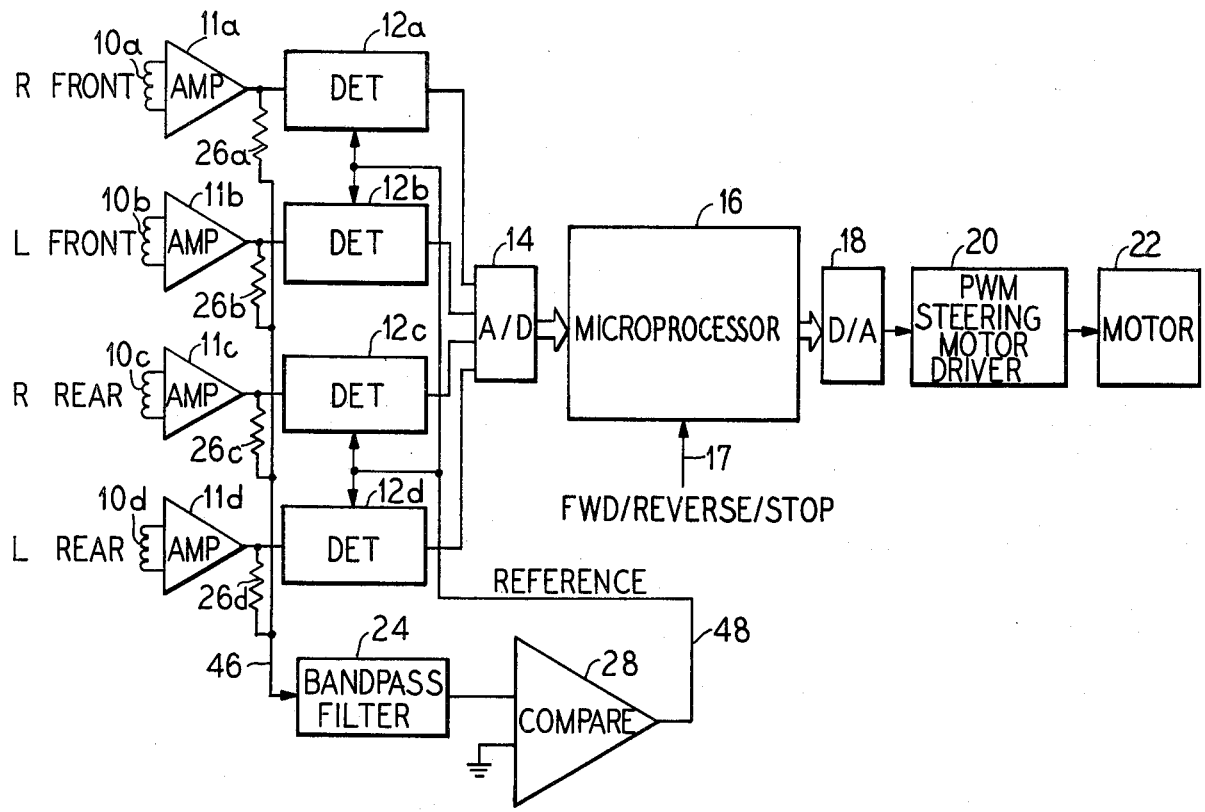
FIG. 1 is a block diagram of the guidance system detector circuit according to the invention.

Referring now more particularly to FIG. 1, a series of separate magnetic coil sensors 10a, 10b, 10c and 10d are each connected to the inputs of separate differential amplifiers 11a, 11b, 11c and 11d. The outputs of the amplifiers 11a through 11d are supplied to separate detector circuits 12a, 12b, 12c and 12d, respectively. As will be explained in greater detail hereinafter, the outputs of the detectors are proportional to the amplitudes of the individual sensor signals and are able to disregard noise signals.

The separate detector output signals are fed through an analog to digital converter 14 and are input to a microprocessor 16. The microprocessor receives forward, reverse and stop signals from separate manual inputs 17 (not shown).

The microprocessor 16 supplies a series of appropriate digital output signals to a digital to analog converter 18. The analog output controls a pulse width modulated steering motor driver circuit 20, of the type which is described more fully in the applicant's earlier referred to patent. Motor driver circuit 20, in turn, controls the motor 22 which turns the ground engaging steering wheel of the guided vehicle so that the vehicle will follow along the path defined by the energized, buried wire.

The outputs of each of the amplifiers 11a, 11b, 11c and 11d are connected through separate resistors 26a, 26b, 26c and 26d, respectively, to the input of a bandpass filter 24. Thus, the input to the bandpass filter 24 is the sum of all of the sensor signals. The bandpass filter generates a synchronous reference signal which is supplied to one input of a comparator 28 whose other input is the circuit ground. The comparator 28 converts the bandpass filter output to a binary signal which is true during the minus half cycles of the input sensor signals and is false during the plus half cycles.

Figure 3:
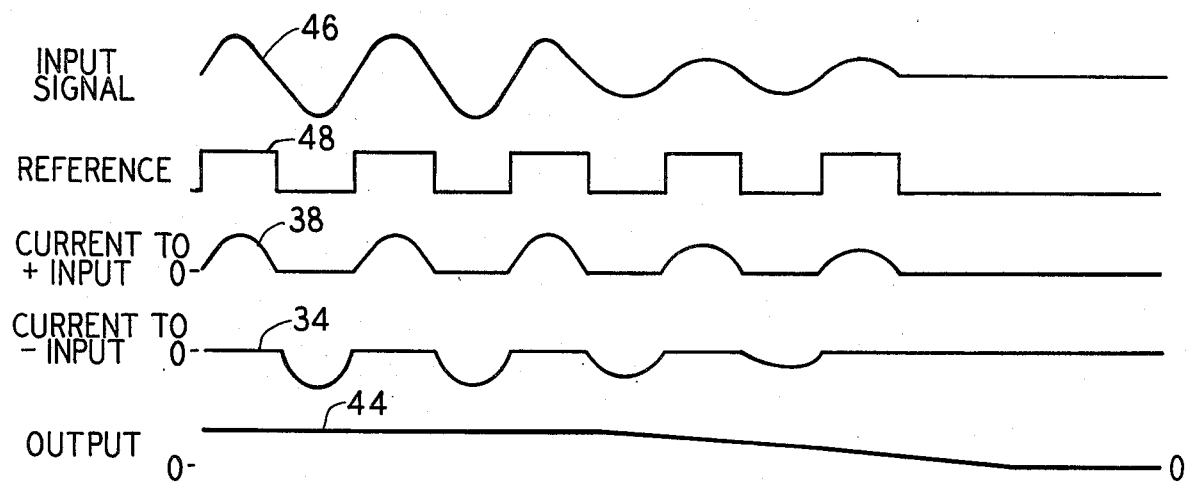
FIG. 3 is a series of waveform diagrams for use in illustrating the operation of the system depicted in FIG. 1.

With reference to FIG. 3, if the input signal waveform is basically sinusoidal with a decreasing amplitude, as illustrated by the waveform 46, the reference signal out of the comparator 28 will be the binary waveform 48 depicted in FIG. 3. It should be understood that the waveform 46 is merely one example of the typical waveform and other sinusoidal waveforms of differing amplitude variations could be expected. This binary reference signal 48 is supplied to each of the detectors 12a, 12b, 12c and 12d.

Figure 2:
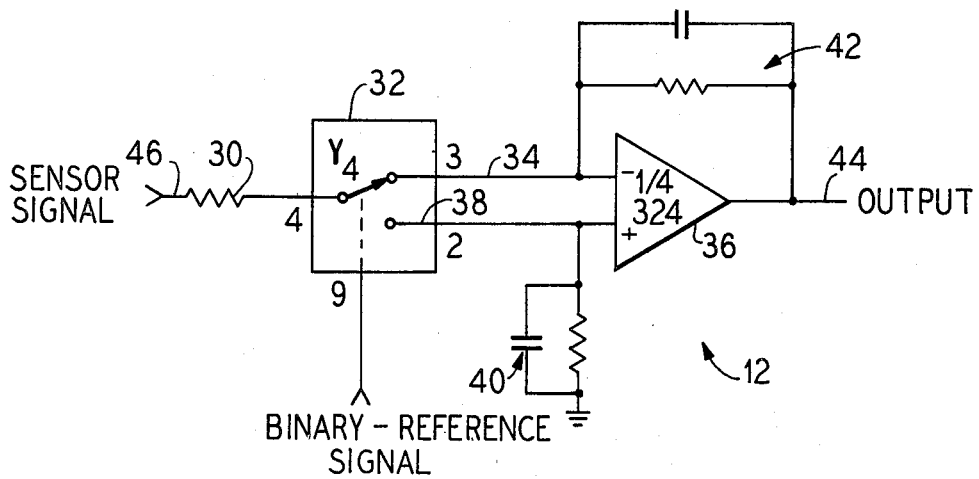
FIG. 2 is a schematic diagram of the detector/filter/amplifier circuit of the system depicted in FIG. 1.

Referring now more particularly to FIG. 2, the details of a typical one of the detector circuits 12 is illustrated. The incoming signal 46 from the sensor amplifier 11 is fed through a resistance 30 to the pole terminal of a single pole double throw switch 32. Actually, the switch 32 is just one-fourth of a CMOS 4-pole-double-throw electronic switch. One contact of the switch 32 is supplied to the inverting (−) input 34 of a differential amplifier 36. The other contact of the switch 32 is connected to the noninverting (+) input 38 of the amplifier 36.

A first parallel connected resistance-capacitance integrating circuit 40 is connected between the input 38 and the circuit ground. A second RC integrating circuit 42 is connected between the output 44 of the amplifier 36 and the input 34.

In operation, whenever the reference signal 48 is true, it causes the switch 32 to connect the resistance 30 to the inverting input of the amplifier 36. When the reference signal is false, the switch 32 connects the resistance 30 to the noninverting input of the amplifier 36. Since the time constant of the integrating circuit 40 applied to the noninverting input 34 is several orders of magnitude slower than the frequency of the reference signal 48, the voltage on the input 34 will be the average sensor signal value during the plus half cycles of the reference signal. Referring again to FIG. 3 where the waveforms at the inputs and output of the amplifier have been appropriately referenced, if the average sensor signal value during minus half cycles is the same as during the plus half cycles, the output of the amplifier 36 will be zero. As the sensor signal amplitude increases, the difference between the average voltage during plus half cycles and during minus half cycles increases and the detector circuit 12 in effect acts as a full wave rectifier. Thus, the DC level of the output 44 will rise as the sensor signal level increases just enough to keep the voltage on the two inputs to the amplifier 36 equal. The output voltage is thus proportional to the amplitude of the input sensor signal.

Since noise signals and signal frequencies other than the one selected by the bandpass filter 24 are not coherent with the reference signal 48, their average value is the same during the plus and minus half of the reference signal. The output thus is a measure of amplitude of only the portion of the input signal which is coherent with the reference signal 48. Note that the frequency of all four detector circuits 12a, 12b, 12c and 12d is determined by the single bandpass filter 24. This greatly simplifies tuning and frequency selection for multifrequency systems. It also eliminates mismatches in detector gain due to variations in tuning accuracy.

The terms and expressions which have been employed here are used in terms of description and not of limitation and there is no intention, in the use of such terms and expressions, of excluding equivalents of the features shown and described, or portions thereof, it being recognized that various modifications are possible within the scope of the invention as claimed.

What is claimed is:

1. A detector circuit for receiving an alternating current input signal and for generating therefrom a direct current output signal whose magnitude is proportional to the amplitude of the input signal, the circuit comprising means for generating a binary signal which is true during minus half cycles of the input signal and is false during positive half cycles of the input signal, differential amplifier means having an output terminal, a first, noninverting input terminal and a second, inverting input terminal, first signal integrating means connected to the first input terminal of the differential amplifier means for time integrating signals applied thereto, second signal integrating means connected between the output terminal and the second input terminal, and switch means controlled by the binary signal for supplying the positive half cycles of the input signal to the first input terminal and the negative half cycles to the second input terminal, whereby the direct current level of the output of the differential amplifier will rise as the amplitude of the input signal increases just enough to keep the voltages on the first and second input terminals equal so that the voltage at the output terminal is proportional to the amplitude of the sensor signal.

2. A detector circuit as recited in claim 1 wherein the binary signal generating means comprise a bandpass filter and voltage comparator means, wherein the input signal is supplied through the bandpass filter to the voltage comparator means, and wherein the voltage comparator means produce the binary output signal.

3. A detector circuit as recited in claims 1 or 2, further comprising a plurality of separate detector circuits for receiving a plurality of separate alternating current input signals, each detector circuit including separate differential amplifier means, separate first and second integrating means and separate switch means and wherein a single binary signal generator means is responsive to the sum of the input signals and supplies a single binary signal to each of the separate switch means.

4. A detector circuit as recited in claim 3 further comprising separate guidance sensors for generating the separate input signals.

5. A circuit for a guidance system of the type having a sensor which generates a cyclic input signal, comprising means supplied with the input signal for generating a binary reference signal which takes one of two levels depending upon a polarity of a simultaneous half cycle of the input signal, differential means having an output and two inputs, the output of the differential means being a difference of the two inputs, integrator means continuously operatively connected to the differential amplifier for creating an integrated signal formed of a plurality of half cycles and switch means responsive to the binary reference signal for supplying entire input signal half cycles of one polarity to one of the inputs of the differential means and entire input signal half cycles of the opposite polarity to the other input of the differential means, the output of the differential means being proportional to the amplitude of the sensor input signal and not to spurious signals which are not coherent with the reference signal.

6. A circuit as recited in claim 5 wherein the binary reference signal generating means comprise a bandpass filter and a voltage comparator connected in series.

7. A circuit for a guidance system of the type having a sensor which generates a cyclic input signal, comprising:

means supplied with the input signal for generating a binary reference signal which takes one of two levels depending upon a polarity of a simultaneous half cycle of the input signal, differential means having an output and two inputs, the output of the differential means being a difference of the two inputs, switch means responsive to the binary reference signal for supplying input signal half cycles of one polarity to one of the inputs of the differential means and input signal half cycles of the opposite polarity to the other input of the differential means, the output of the differential means being proportional to the amplitude of the sensor input signal alone and not to spurious signals which are not coherent with the reference signal, and the differential means comprising a differential amplifier having an inverting input, a non-inverting input, and an output, first integrating means connected to the non-inverting input to integrate signals applied thereto, and second integrating means connected between the inverting input and the output of the differential amplifier.

8. A circuit as recited in claim 7 wherein the switch means supply the positive half cycles of the input signal to the non-inverting input and the negative half cycles of the input signal to the inverting input.

9. A circuit according to claim 5 wherein the guidance system has a plurality of sensors, one of said differential means and switch means being associated with each sensor generated input signal, and input signals from all the sensors being coupled to a single one of the binary reference signal means.

10. A guidance system sensor circuit, comprising:

sensor means for producing a cyclic sensor signal;

reference means supplied with the sensor signal for creating a reference binary square wave signal with upper and lower states corresponding to positive and negative going half cycles of the cyclic sensor signal;

switching means connected to the sensor signal having first and second outputs, said switching means being controlled by the reference signal such that the entire positive going half cycles of the sensor signal are produced at the first output and the entire half cycle signals of opposite polarity are produced at the second output;

a differential amplifier having first and second inputs respectively connected to the first and second outputs of the switch means and receiving said positive going half cycles on said first input and said half cycles of opposite polarity at said second input; and integration means continuously operatively connected to the differential amplifier such that an analog output signal representative of an amplitude of the sensor signal is produced at an output of the differential amplifier, whereby spurious signals present with the sensor signals are substantially eliminated at the output of the differential amplifier.

* * * * *